US008456931B2

(12) United States Patent
Ku

(10) Patent No.: US 8,456,931 B2
(45) Date of Patent: Jun. 4, 2013

(54) DATA TRANSMISSION DEVICE

(75) Inventor: Young Jun Ku, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 259 days.

(21) Appl. No.: 12/947,298

(22) Filed: Nov. 16, 2010

(65) Prior Publication Data

US 2011/0292745 A1    Dec. 1, 2011

(30) Foreign Application Priority Data

May 31, 2010    (KR) ................... 10-2010-0051292

(51) Int. Cl.
*G11C 7/00* (2006.01)

(52) U.S. Cl.
USPC .................. 365/189.16; 365/189.05; 365/201

(58) Field of Classification Search
USPC .................... 365/189.16, 189.05, 201, 193
See application file for complete search history.

(56) References Cited

U.S. PATENT DOCUMENTS

| 7,333,908 B2 * | 2/2008 | Johnson ................... 702/120 |
| 7,574,634 B2 * | 8/2009 | Stave ...................... 714/718 |
| 7,664,999 B2 * | 2/2010 | Stave ...................... 714/718 |
| 2003/0053471 A1 | 3/2003 | Stief |
| 2007/0070743 A1 * | 3/2007 | Do et al. .................. 365/201 |
| 2010/0169583 A1 * | 7/2010 | Chung et al. .............. 711/149 |

FOREIGN PATENT DOCUMENTS

| JP | 2003-085999 | 3/2003 |
| JP | 2009-103567 | 5/2009 |
| KR | 100558492 B1 | 2/2006 |

* cited by examiner

*Primary Examiner* — Gene Auduong
(74) *Attorney, Agent, or Firm* — William Park & Associates Patent Ltd.

(57) ABSTRACT

A data transmission device in a semiconductor memory apparatus receives input data via a local data input/output line and output s the input data on a plurality of global data input/output lines. The data transmission device includes a write data generation block configured to receive the input data and test data and output one of input data and test data as write data in response to an activation of a test enable signal, and a loading block configured to apply the write data to one of the plurality of global data input/output lines in response to an enable signal.

17 Claims, 5 Drawing Sheets

DATA TRANSMISSION DEVICE

CROSS-REFERENCES TO RELATED APPLICATION

The present application claims priority under 35 U.S.C. §119(a) to Korean Application No. 10-2010-0051292, filed on May 31, 2010, in the Korean Intellectual Property Office, which is incorporated herein by reference in its entirety as if set forth in full.

BACKGROUND

1. Technical Field

The present invention relates to a semiconductor memory apparatus, and more particularly, to a semiconductor memory apparatus including a data transmission device.

2. Related Art

Data input operations in a synchronous semiconductor memory apparatus are typically performed in synchronization with an internal clock signal which is generated based on an external clock signal. The synchronous semiconductor memory apparatus uses a pre-fetch scheme and may input multi-bit data in response to one-time input command. The pre-fetch scheme is a data input method by which serial multi-bit data sequentially inputted to each data pad in response to one-time input command is temporarily stored in a data transmission device, and then is applied to a plurality of input/output lines at once. A 2-bit pre-fetch scheme, a 4-bit pre-fetch scheme and an 8-bit pre-fetch scheme are used depending on the type of the synchronous semiconductor memory apparatus. For example, in the case of using the 8-bit pre-fetch scheme, 8-bit data is serially inputted through data pads in response to a one-time input command. Such 8-bit serial data is stored in the data transmission device until the least significant bit (LSB) of the 8-bit serial data is inputted, and then is simultaneously applied to 8 parallel input/output lines in response to an activation of an enable signal. The enable signal is activated once in response to the one-time input command. As described above, the multi-bit pre-fetch type semiconductor memory apparatus includes a data transmission device that latches serially inputted data to be applied to the parallel input/output lines, and simultaneously applies the data to the input/output lines in response to the enable signal GIO_en (see FIG. 1).

FIG. 1 is a block diagram of a conventional data transmission device in a semiconductor memory apparatus. The conventional data transmission device receives input data Din from a single local data input/output line, and transmits the input data to a plurality of global output data lines GIO1, GIO2. The conventional data transmission device includes a plurality of write data generation blocks, which generate write data from input data Din and latch the write data, and a plurality of loading blocks which apply the write data to respective input/output lines. FIG. 1 illustrates the 2 bit pre-fetch scheme which includes two write data generation blocks 11 and 12 and two loading blocks 21 and 22.

The data transmission device shown in FIG. 1 includes the first and second write data generation blocks 11 and 12 that perform serial input/output operations, and the first and second loading blocks 21 and 22. The first loading block 21 is connected between the first write data generation block 11 and a first input/output line GIO1, and the second loading block 22 is connected between the second write data generation block 12 and a second input/output line GIO2. The first write data generation block 11 latches the input data Din in response to a data strobe signal DQS inputted from outside, and outputs first write data Wdata1. Since the serial input/output operation is performed between the first write data generation block 11 and the second write data generation block 12, the first write data Wdata1 serves as an input of the second write data generation block 12. In FIG. 1 which illustrates the 2-bit pre-fetch scheme, the input data Din is a signal containing the sequentially inputted two bits in total. When the data strobe signal DQS is initially activated, the first bit of the input data Din is latched by the first write data generation block 11 and the first write data Wdata1 is generated from the first bit. When the data strobe signal DQS is subsequently activated, the first write data Wdata1 is latched by the second write data generation block 12 and the second write data Wdata1 is generated from the first write data Wdata1. At this time, the second bit of the input data Din is latched by the first write data generation block 11 and the first write data Wdata1 is generated from the second bit. As the data strobe signal DQS is activated twice, the 2-bit input data Din is latched to be the first write data Wdata1 and the second write data Wdata2. The input data Din serially inputted based on the activation of the data strobe signal DQS is latched to be the first write data Wdata1 and the second write data Wdata2 (that is, parallel data) by the first write data generation block 11 and the second write data generation block 12. When the enable signal GIO_en is activated, the first write data Wdata1 and the second write data Wdata2 latched by the first write data generation block 11 and the second write data generation block 12 are applied to the first input/output line GIO1 and the second input/output line GIO2 by the first loading block 21 and the second loading block 22, respectively. Based on the operational principle described above, the data transmission device having the 2-bit pre-fetch scheme requires two periods of the data strobe signal DQS in order to apply the sequentially inputted 2-bit input data Din to the first input/output line GIO1 and the second input/output line GIO2. Since the data strobe signal DQS typically has a period equal to that of an external clock, the data transmission device having the 2-bit pre-fetch scheme requires time corresponding to two periods based on the external clock in order to apply the sequentially inputted 2-bit input data Din to the first input/output line GIO1 and the second input/output line GIO2. Thus, a semiconductor memory apparatus including the data transmission device shown in FIG. 1 needs to have the operation time longer than two periods of the external clock from an input command to the next input command. The time from the input command to the next input command varies depending on the pre-fetch scheme. For example, a data transmission device having the 8-bit pre-fetch scheme needs to have the operation time longer than eight periods of the external clock from the input command to the next input command. If a double data rate (DDR) scheme is used in the semiconductor memory apparatus as well as a pre-fetch scheme, the required time from one input command to the next input command may be reduced to ½. For example, a semiconductor memory apparatus using the 8-bit pre-fetch scheme and the DDR scheme needs to have the operation time longer than four periods of the external clock from one input command to the next input command.

FIG. 2 is a circuit diagram of the first write data generation block and the first loading block shown in FIG. 1. Since the second write data generation block 12 and the second loading block 22 may have the same configurations as those of the first write data generation block 11 and the first loading block 21, a detailed description thereof will be omitted. The first write data generation block 11 latches the input data Din in response to the data strobe signal DQS inputted from outside, and outputs the first write data Wdata1. The first loading block 21 applies the first write data Wdata1 to the first input/output line GIO1 in response to the enable signal GIO_en. The write data generation block is coupled in series to the loading block and may be used for the multi-bit pre-fetch scheme as in the example of FIG. 1. For example, the 8-bit pre-fetch scheme needs 8 pairs of the write data generation block and the loading block. The first write data generation block 11 of FIG. 2 applies the input data Din to a first latch L1 at a falling edge of the data strobe signal DQS, and applies data in the first latch L1 to a second latch L2 at a rising edge of the data strobe signal DQS. That is, the data in the two latches L1 and L2 are shifted every one period of the data strobe signal DQS which swings between a high level and a low level. The data, which is applied to the second latch L2 and stored therein, that is, the first write data Wdata1 serves as input data Wdata1 of the second write data generation block 12 (see FIG. 1) of the next stage, which is connected in series to the first write data generation block 11. When the enable signal GIO_en is activated, the first loading block 21 applies the first write data Wdata1 latched by the second latch L2 to the first input/output line GIO1. In the case of the 8-bit pre-fetch scheme, in order for the respective write data generation blocks to latch all 8-bit data of the data strobe signal DQS, the data strobe signal DQS needs to be swung between a high level and a low level eight times. Furthermore, since the data strobe signal DQS is synchronized with an external clock signal, a semiconductor memory apparatus using the 8-bit pre-fetch scheme has to follow the operational rule that each input command may not be inputted in eight clocks (four clocks in the case of using the DDR scheme with the 8-bit pre-fetch scheme). FIG. 3 is a signal waveform diagram explaining the operational rule.

FIG. 3 shows waveforms in which data D0 to D7 are serially inputted to a plurality of data pads DQ<0> to DQ<3> in response to input commands WT0 and WT1 inputted every four period of a clock signal CLOCK in a semiconductor memory apparatus using both the 8-bit pre-fetch scheme and the DDR scheme. Furthermore, FIG. 3 shows a waveform 'a' in which the 8-bit data is simultaneously applied to an input/output line in a parallel manner in response to the enable signal GIO_en (see FIG. 1) after all the 8-bit data is serially applied.

The semiconductor memory apparatus is executed through data input/output operations from and to memory cells. In order to verify normal functioning of a cell during manufacturing of a semiconductor memory apparatus, it is determined whether the cell is capable of performing normal operations by applying a stress to the cell, or performing the data input/output operation with respect to the cell without applying a stress. Such a test is called a programmable stress test. The programmable stress test is performed by loading the semiconductor memory apparatus onto test equipment, and performing the data input/output operation with respect to the cell. As the semiconductor memory apparatus is highly integrated and operates at a high speed, the test time of the programmable stress test increases more and more. The programmable stress test is used to determine whether the semiconductor memory apparatus is capable of performing normal operations by conducting the data input/output operation with respect to the cell. As the semiconductor memory apparatus is highly integrated, the large number of cells are included in the semiconductor memory apparatus. Therefore, the programmable stress test time also increases. Furthermore, as the semiconductor memory apparatus operates at a high speed, the semiconductor memory apparatus may have to operate in response to a faster clock signal. However, a clock signal inputted from a programmable stress test equipment is slower than a high speed clock signal operable in the semiconductor memory apparatus. The programmable stress test equipment inputs the clock signal, which may be slower than the high speed clock signal operable in the semiconductor memory apparatus, to the semiconductor memory apparatus by the following two reasons. First, when a fail in the cell has occurred during the data input/output operation, it is necessary to avoid a situation in which it may not be possible to determine whether the reason for the fail is caused by the lack of a margin for a high speed operation or the abnormal operation of the cell, that is, it is necessary to ensure the reliability of the programmable stress test. Second, since the semiconductor memory apparatus operating at a higher speed is tested using a traditional programmable stress test equipment, the high speed clock signal operable in the semiconductor memory apparatus may be faster than a clock signal inputted from the programmable stress test equipment.

At the present time, the period of a clock signal operable in a DDR3 semiconductor memory apparatus is approximately 1 ns to approximately 2 ns. However, the period of a clock signal inputted from the programmable stress test equipment to the semiconductor memory apparatus is approximately 16 ns. Since the period of the clock signal used for the programmable stress test may be longer than that of the high speed clock signal operable in the semiconductor memory apparatus, and an input command may not be inputted in four periods of a clock according to the 8-bit pre-fetch scheme and the DDR scheme as described above, the programmable stress test time is inefficiently increased. Such a problem becomes severer as the semiconductor memory apparatus is highly integrated and operates at a high speed. Since the increase in the test time may cause an increase in the production time of the semiconductor memory apparatus, the semiconductor memory apparatus has disadvantages in terms of the production cost and manufacturing efficiency.

SUMMARY

In one embodiment of the present invention, a data transmission device in a semiconductor memory apparatus, the data transmission device receiving input data via a local data input/output line and output the input data on a plurality of global data input/output lines, includes: a write data generation block configured to receive the input data and test data and output one of the input data and the test data as write data in response to an activation of a test enable signal; and a loading block configured to apply the write data to one of the plurality of global data input/output lines in response to an enable signal.

In another embodiment of the present invention, a data transmission device is provided which is configured to sequentially latch a plurality of input data inputted every one period of a clock signal and apply the plurality of input data to a plurality of input/output lines in response to an enable signal activated every predetermined period of the clock signal in a normal mode, and configured to apply test data to the plurality of input/output lines in response to the enable signal activated every one period of the clock signal in a test mode.

In still another embodiment of the present invention, a data transmission device is provided which includes: a first write data generation block configured to generate first write data from one of input data and first test data in response to a test enable signal and a data strobe signal; a first loading block configured to apply the first write data to a first input/output line in response to an enable signal; a second write data generation block configured to generate second write data from one of the first write data and second test data in response to the test enable signal and the data strobe signal; and a second loading block configured to apply the second write data to a second input/output line in response to the enable signal.

BRIEF DESCRIPTION OF THE DRAWINGS

Features, aspects, and embodiments are described in conjunction with the attached drawings, in which.

DETAILED DESCRIPTION

A data transmission device according to one embodiment may reduce input time of a programmable stress test by allowing data which is to be inputted at the time of the programmable stress test, to be received using a test mode signal, instead of receiving the data through data pads. Since the programmable stress test is used to check whether a cell is capable of performing normal input/output operations, it may be possible to test the capacity of a cell to perform normal data input/output operations even if the data is not necessarily received from the data pads. In this regard, the data transmission device according to one embodiment includes elements configured to latch normal data and elements configured to output predetermined test data, and may directly apply the predetermined test data to input/output lines, without waiting for data input from the data pads at the start of the programmable stress test.

Figure 4:
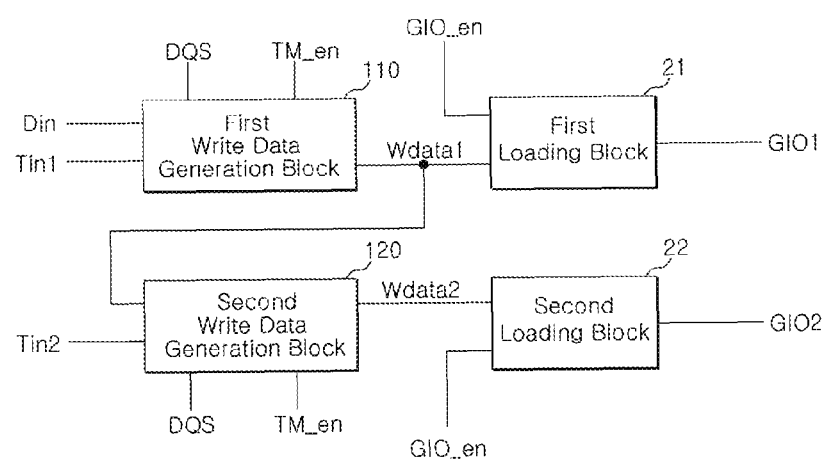
FIG. 4 is a schematic block diagram of a data transmission device according to one embodiment.

FIG. 4 is a schematic block diagram of the data transmission device according to one embodiment.

The data transmission device includes a plurality of write data generation blocks 110 and 120 connected to one another in series, and a plurality of loading blocks 21 and 22 connected between the plurality of write data generation blocks and a plurality of input/output lines, respectively. For the sake of convenience in explanation, FIG. 4 shows the data transmission device including two write data generation blocks 110 and 120 and two loading blocks 21 and 22.

The data transmission device receives input data Din from a single local data input/output line, and transmits the input data to a plurality of global output data lines GIO1, GIO2. But, the data transmission device according to one embodiment may be used between any other input/output lines, as well as local input/output line and global input/output line.

The data transmission device includes a first write data generation block 110, a second write data generation block 120, a first loading block 21, and a second loading block 22. The data transmission device operates in one of the two operation modes, i.e., a normal mode and a test mode. The operation mode is defined based on a test enable signal TM_en inputted to the first write data generation block 110 and the second write data generation block 120.

Figure 1:
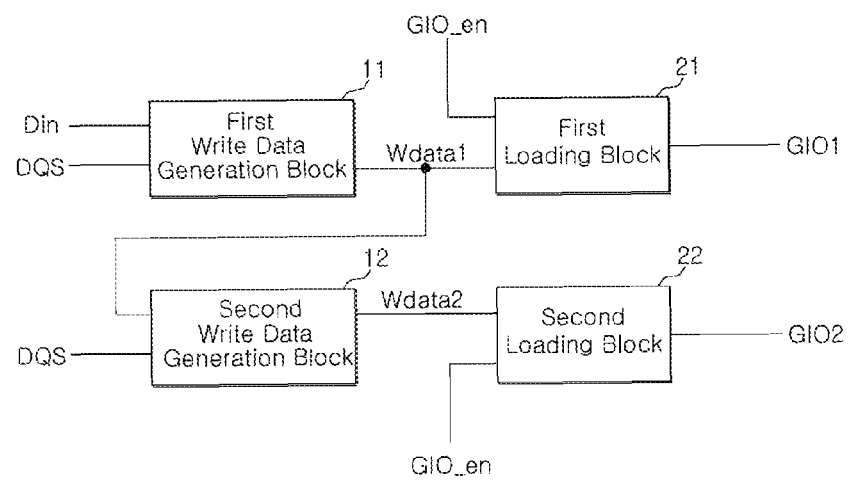
FIG. 1 is a schematic block diagram of a conventional data transmission device.

When the data transmission device operates in the normal mode, which is similar to the operation of the conventional data transmission device shown in FIG. 1, the data transmission device sequentially latches 2-bit input data Din, which is serially inputted to the first write data generation block 110, as first write data Wdata1 and second write data Wdata2 by using the first write data generation block 110 and the second write data generation block 120 based on the activation of the data strobe signal DQS, and to apply the first write data Wdata1 and the second write data Wdata2 to the first input/output line GIO1 and the second input/output line GIO2 when the enable signal GIO_en is inputted. The time necessary for the first write data generation block 110 and the second write data generation block 120 to latch the 2-bit input data Din as the first write data Wdata1 and the second write data Wdata2 corresponds to two periods of the data strobe signal DQS. This time is equal to the time of the conventional data transmission device. This is because one period of the data strobe signal DQS is necessary to store the first bit of the 2-bit input data Din as the first write data Wdata1, and the other period of the data strobe signal DQS is necessary to store the first bit of the 2-bit input data Din, which is stored as the first write data Wdata1, as the second write data Wdata2, and to store the second bit of the input data Din as new first write data Wdata1. Like the conventional data transmission device, when the enable signal GIO_en is activated, the first loading block 21 and the second loading block 22 may apply the first write data Wdata1 and the second write data Wdata2 to the first input/output line GIO1 and the second input/output line GIO2, respectively. Since the enable signal GIO_en may be activated after the input data Din is latched to be the first write data Wdata1 and the second write data Wdata2, the enable signal GIO_en may be activated every predetermined time period or more based on an external clock signal. Since the 2-bit pre-fetch scheme is exemplified in FIG. 4, the enable signal GIO_en may be activated every two periods or more based on the external clock signal.

The data transmission device operates in the test mode as follows. In the test mode, the first write data generation block 110 and the second write data generation block 120 may output first test data Tin1 and second test data Tin2 as the first write data Wdata1 and the second write data Wdata2, respectively, regardless of the activation timing of the data strobe signal DQS, This is different from the normal mode in which the input data Din and the first write data Wdata1 are output as the first write data Wdata1 and the second write data Wdata2, respectively, in response to the data strobe signal DQS. Like the conventional data transmission device, when the enable signal GIO_en is activated, the first loading block 21 and the second loading block 22 may apply the first write data Wdata1 and the second write data Wdata2 to the first input/output line GIO1 and the second input/output line GIO2, respectively. In the test mode, the time necessary for the first write data generation block 110 and the second write data generation block 120 to latch the first write data Wdata1 and the second write data Wdata2 is equal to or less than one period. Unlike the normal mode in which two periods of the data strobe signal DQS are required because the first write data generation block 110 and the second write data generation block 120 generate the first write data Wdata1 and the second write data Wdata2 based on the activation timing of the data strobe signal DQS, the first write data generation block 110 and the second write data generation block 120 have only to directly output the first test data Tin1 and the second test data Tin2 as the first write data Wdata1 and the second write data Wdata2 regardless of the activation timing of the data strobe signal DQS in the test mode. Consequently, in the test mode, the enable signal GIO_en may be activated every one period based on the external clock signal.

The first write data generation block 110 may be configured to receive the input data Din, the first test data Tin1, the data strobe signal DQS, and the test enable signal TM_en and generate the first write data Wdata1. The first write data generation block 110 is configured to operate in a different mode in response to the test enable signal TM_en. In the normal mode, like the conventional write data generation block 11 of FIG. 1, the first write data generation block 110 outputs the input data Din as the first write data Wdata1 based on the activation timing of the data strobe signal DQS. In the test mode, the first write data generation block 110 outputs the first test data Tin1 as the first write data Wdata1.

The second write data generation block 120 may have the same configuration as that of the first write data generation block 110. The second write data generation block 120 may be configured to receive the first write data Wdata1, the second test data Tin2, the data strobe signal DQS, and the test enable signal TM_en and generate the second write data Wdata1. Since the second write data generation block 120 performs the same operation as that of the first write data generation block 110, a detailed description thereof will be omitted.

Since the first loading block 21 and the second loading block 22 have the same configurations as those of the first loading block 21 and the second loading block 22 and perform the same operations as those of the first loading block 21 and the second loading block 22, a detailed description thereof will be omitted.

The data transmission device shown in FIG. 4 uses the 2-bit pre-fetch scheme. When the data transmission device operates in the normal mode, two periods of the data strobe signal DQS are required to latch the input data Din as the first write data Wdata1 and the second write data Wdata2. Since the data strobe signal DQS has the same period as that of an external clock, when the data transmission device operates in the normal mode, two periods are required based on the external clock for the data transmission device to latch the first write data Wdata1 and the second write data Wdata2. If the data transmission device uses the 8-bit pre-fetch scheme, eight periods are required based on the external clock. However, when the data transmission device operates in the test mode, the time necessary for the first write data generation block 110 and the second write data generation block 120 to latch the first write data Wdata1 and the second write data Wdata2 is equal to or less than one period based on the external clock. This time is not changed by is a pre-fetch scheme used by the data transmission device. This is because the first write data generation block 110 and the second write data generation block 120 output the first test data Tin1 and the second test data Tin2 as the first write data Wdata1 and the second write data Wdata2, respectively.

This helps to substantially reduce the test time of the semiconductor memory apparatus. As described above, in the semiconductor memory apparatus using the 8-bit pre-fetch scheme, an input command may be inputted once every eight clock at minimum. However, in the semiconductor memory apparatus including the data transmission device according to the embodiment, since the test data Tin1 and Tin2 may be directly applied to the input/output lines, an input command may be inputted once every one clock. For example, when it is assumed that the period of an inputted clock is approximately 16 ns, the conventional input time is approximately 128 ns and the input time according to one embodiment is approximately 16 ns (when applying the DDR scheme, approximately 64 ns and approximately 16 ns). As the input time is reduced, the total test time is reduced, thereby giving a great help to an increase in the manufacturing efficiency of the semiconductor memory apparatus.

Figure 5:
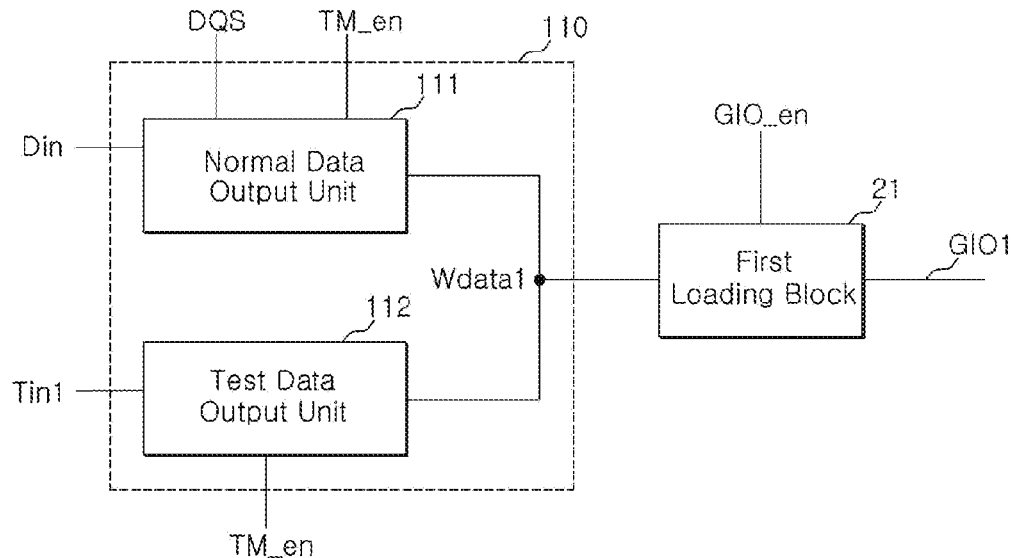
FIG. 5 is a detailed block diagram of a data transmission device of FIG. 4 according to one embodiment.

FIG. 5 is a detailed block diagram of the data transmission device of FIG. 4 according to one embodiment. FIG. 5 shows a pair of the first write data generation block 110 and the first loading block 21. The second write data generation block 120 and the second loading block 22 may have the same configurations as those of the first write data generation block 110 and the first loading block 21.

As in FIG. 4, the data transmission device includes the first write data generation block 110 and the first loading block 21.

The first write data generation block 110 includes a normal data output unit 111 and the test data output unit 112.

When the test enable signal TM_en is deactivated, the normal data output unit 111 outputs the input data Din as the first write data Wdata1 in response to the data strobe signal DQS.

When the test enable signal TM_en is activated, the test data output unit 112 outputs the first test data Tin1 as the first write data Wdata1.

The test enable signal TM_en may use a test mode signal. The test enable signal TM_en is used to determine whether the data transmission device operates in the test mode or the normal mode. The test mode is used for determining whether the cell is capable of performing normal operations by performing a data input/output operation with respect to the cell, as with the programmable stress test. The test mode may be applied to all tests in which a test operation is possible only through input/output of predetermined data even if data is not inputted/outputted to/from a storage of a memory device through data pads.

Figure 6:
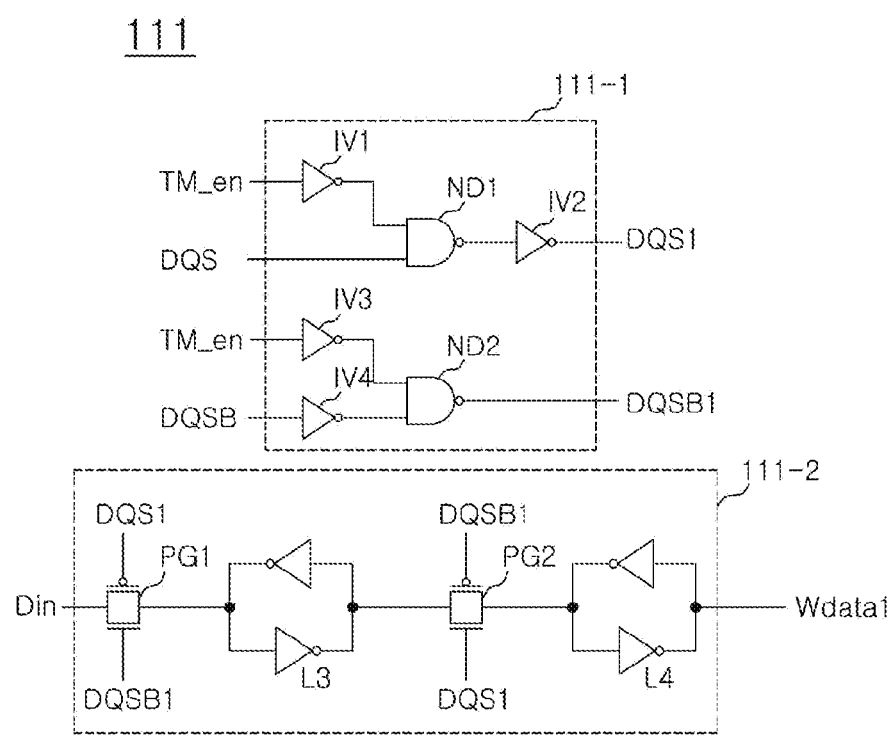
FIG. 6 is a circuit diagram of a normal data output unit of FIG. 5 according to one embodiment.

FIG. 6 is a circuit diagram of the normal data output unit of FIG. 5 according to one embodiment.

The normal data output unit 111 may include a data timing signal generation section 111-1 and a data transmission section 111-2.

The data timing signal generation section 111-1 is configured to receive the test enable signal TM_en and the data strobe signal DQS and generate a data timing signal DQS1. The data timing signal generation section 111-1 is configured to generate the data timing signal DQS1 having different characteristics based on the test enable signal TM_en. When the test enable signal TM_en is activated and the data transmission device operates in the test mode, the first write data Wdata1 should be generated based on the first test data Tin1. Therefore, in the test mode, the data timing signal generation section 111-1 is configured to generate the data timing signal DQS1 such that the data transmission section 111-2 is deactivated. However, when the test enable signal TM_en is deactivated and the data transmission device operates in the normal mode, the first write data Wdata1 should be generated based on the input data Din. Therefore, in the normal mode, the data timing signal generation section 111-1 is configured to generate the data timing signal DQS1 such that the data transmission section 111-2 may output the input data Din as the first write data Wdata1 based on the activation timing of the data strobe signal DQS.

Figure 2:
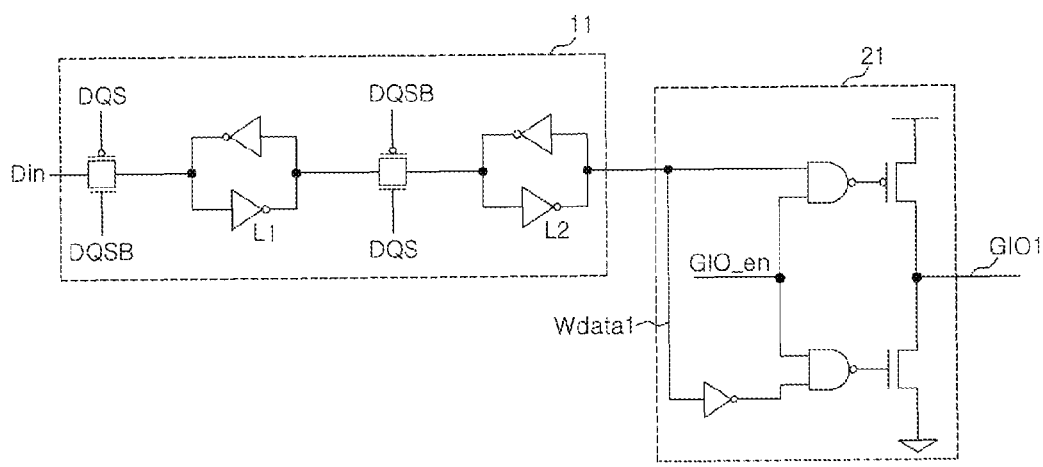
FIG. 2 is a circuit diagram of a write data generation block and a loading block shown in FIG. 1.

The data transmission section 111-2 has a configuration similar to that of the first write data generation block 11 of FIG. 1 according to the conventional art. However, unlike the first write data generation block 11, since the data transmission section 111-2 is configured to output the input data Din as the first write data Wdata1 based on the data timing signal DQS1 generated by the logical combination of the test enable signal TM_en and the data strobe signal DQS, the data transmission section 111-2 may output or may not output the input data Din as the first write data Wdata1 based on the operation mode. In FIGS. 2 and 6, the data strobe signal DQS has a phase opposite to that of a data strobe bar signal DQSB, and the data timing signal DQS1 has a phase opposite to that of a data timing bar signal DQSB1, which determine the timing, at which the input data Din is outputted as the first write data Wdata1, and have the same characteristics. Therefore, for the sake of convenience in explanation, the data strobe signal DQS and the data strobe bar signal DQSB are referred to as the data strobe signal DQS, and the data timing signal DQS1 and the data timing bar signal DQSB1 are referred to as the data timing signal DQS1.

The data timing signal generation section 111-1 may include first to fourth inverters IV1 to IV4, and first and second NAND gates ND1 and ND2. The first inverter IV1 is configured to receive and invert the test enable signal TM_en and output an inverted signal. The first NAND gate ND1 is configured to receive the signal outputted from the first inverter IV1 and the data strobe signal DQS, perform a NAND operation on the signal and the data strobe signal DQS, and output a signal obtained through the NAND operation. The second inverter IV2 is configured to invert the signal outputted from the first NAND gate ND1 and output the data timing signal DQS1. The third inverter IV3 is configured to receive and invert the test enable signal TM_en. The fourth inverter IV4 is configured to receive and invert the data strobe bar signal DQSB. The second NAND gate ND2 is configured to perform a NAND operation on signals outputted from the third inverter IV3 and the fourth inverter IV4, and output the data timing bar signal DQSB1. The data timing signal generation section 111-1 operates as follows. When the test enable signal TM_en is activated, the data timing signal DQS1 is held to a low level and the data timing bar signal DQSB1 is held to a high level. Therefore, a second pass gate PG2 of the data transmission section 111-2 is deactivated, and the data transmission section 111-2 does not generate the first write data Wdata1. On the other hand, when the test enable signal TM_en is deactivated, the data timing signal DQS1 is the same as the data strobe signal DQS, and the data timing bar signal DQSB1 is the same as the data strobe bar signal DQSB. Therefore, when the test enable signal TM_en is deactivated, the data transmission section 111-2 operates in a similar manner to the conventional write data generation block 11 of FIG. 1.

The data transmission section 111-2 may include first and second pass gates PG1 and PG2 and third and fourth latches L3 and L4. The first pass gate PG1 receives the input data Din and is activated in response to the data timing signal DQS1. The third latch L3 is configured to latch data outputted from the first pass gate PG1. The second pass gate PG2 is activated in response to the data timing signal DQS1 to receive data outputted from the third latch L3. The fourth latch L4 is configured to latch data, which is outputted from the second pass gate PG2, as the first write data Wdata1. The first pass gate has activation timing different from that of the second pass gate. When the data timing signal DQS1 swings between a high level and a low level, the first pass gate and the second pass gate are activated at the falling edge and the rising edge of the data timing signal DQS1, respectively.

Figure 7:
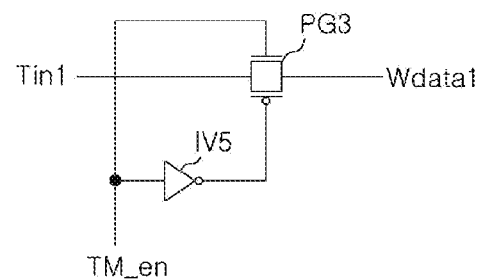
FIG. 7 is a circuit diagram of a test data output unit of FIG. 5 according to one embodiment.

FIG. 7 is a circuit diagram of the test data output unit of FIG. 5 according to one embodiment.

The test data output unit 112 is configured to output the first test data Tin1 as the first write data Wdata1 in response to the test enable signal TM_en. The test data output unit 112 may include a fifth inverter IV5 and a third pass gate PG3. The fifth inverter IV5 is configured to invert and output the test enable signal TM_en. The third pass gate PG3 is activated in response to the test enable signal TM_en to output the first test data Tin1 as the first write data Wdata1. When the test enable signal TM_en is activated, the test data output unit 112 operates in the test mode to output the first test data Tin1 as the first write data Wdata1. However, when the test enable signal TM_en is deactivated, the test data output unit 112 operates in the normal mode and does not generate the first write data Wdata1. Since the normal data output unit 111 and the test data output unit 112 shown in FIGS. 6 and 7 generate the first write data Wdata1 at different time points according to whether the test enable signal TM_en is activated, there is no case in which the normal data output unit 111 and the test data output unit 112 simultaneously generate the first write data Wdata1.

Figure 8A:
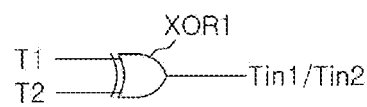
FIG. 8A is a circuit diagram of a test data generation block according to one embodiment.

As well as the first test data Tin1, test data (not shown) inputted to each write data generation unit (not shown) may be realized using a test mode signal. Furthermore, the test data may be created according to the design of those skilled in the art using the logical combination (for example, XOR) of a plurality of test mode signals. The creation of the test data through the logical combination of the plurality of test mode signals may be realized by connecting a new test data generation block 210 in series to the front stage of the first write data generation block 110 and the second write data generation block 120 shown in FIG. 4, wherein the test data generation block 210 is configured to receive a first test mode signal T1 and a second test mode signal T2, perform an XOR operation on the first test mode signal T1 and the second test mode signal T2, and generate the test data Tin1 or Tin2 as shown in FIG. 8A.

Figure 8B:
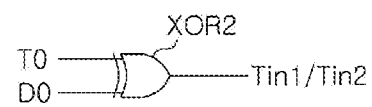
FIG. 8B is a circuit diagram of a test data generation block according to another embodiment.

Furthermore, the test data may be created using the logical combination (for example, XOR) of the input data Din and a test mode signal. If so, the following advantages may be achieved. As described above, since the data transmission device according to one embodiment may directly apply predetermined test data to the input/output lines GIO, it may be possible to reduce the input time of the entire test by completing data input to the cell during one period of the clock signal. In the case of the data transmission device in which the test data Tin is created only using the test mode signal, it may be necessary to differently set the test mode signal in order to exchange data inputted to the cell. In order to differently set the test mode signal, setting time of test equipment is additionally required. Therefore, the test data is created using the logical combination of a test signal and at least a part of the input data Din, so that the test data may be changed through a change in the input data Din without additional setting time of the test equipment. In such a case, the test time may be reduced. The creation of the test data through the combination of the test signal and at least a part of the input data Din may be realized by coupling a new test data generation block 220 in series to the front stage of the first write data generation block 110 and the second write data generation block 120 shown in FIG. 4, wherein the test data generation block 220 is configured to perform an XOR operation on the first bit D0 of the input data Din and a test mode signal TO, and generate the test data Tin1 or Tin2 as shown in FIG. 8B.

Figure 9:
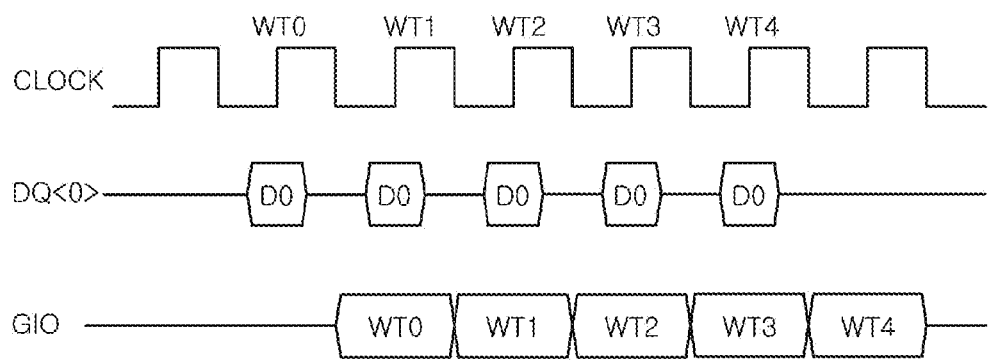
FIG. 9 is a waveform diagram at the time of data input in a semiconductor memory apparatus including a data transmission device according to one embodiment.

FIG. 9 is a waveform diagram illustrating the case in which an input command is inputted once every one period of a clock in the semiconductor memory apparatus including the data transmission device according to one embodiment.

Figure 3:
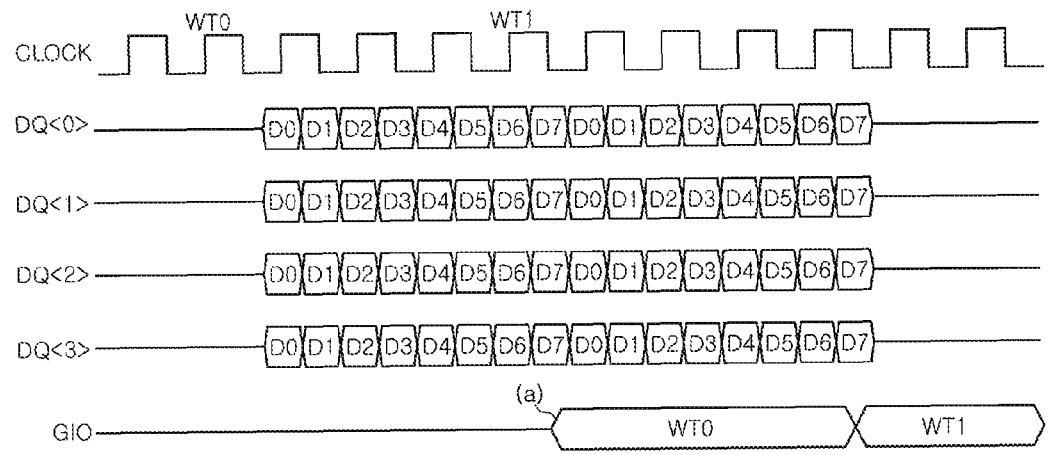
FIG. 3 is a waveform diagram at the time of data input in a semiconductor memory apparatus including a conventional data transmission device.

As described above, in the data transmission device according to one embodiment, since the predetermined test data Tin may be applied to the input/output lines during one period without waiting until the 8-bit input data Din inputted through the data pads are completely inputted during four clocks as shown in the waveform diagram of FIG. 3, input commands WT0 to WT4 may be inputted in each clock, respectively, as shown in FIG. 9, resulting in the reduction in the test time as compared with the conventional art. The waveform of DQ<0> shown in FIG. 9 relates to the case in which the test data Tin is created using the logical combination of the test mode signal and the input data Din. In such a case, the test data Tin1 is created using the logical combination of the first bit D0 of the input data Din inputted through the data pad DQ<0> and the test mode signal, and the first bit D0 of the input data Din is adjusted, so that the test data Tin1 may be adjusted more quickly.

Figure 10:
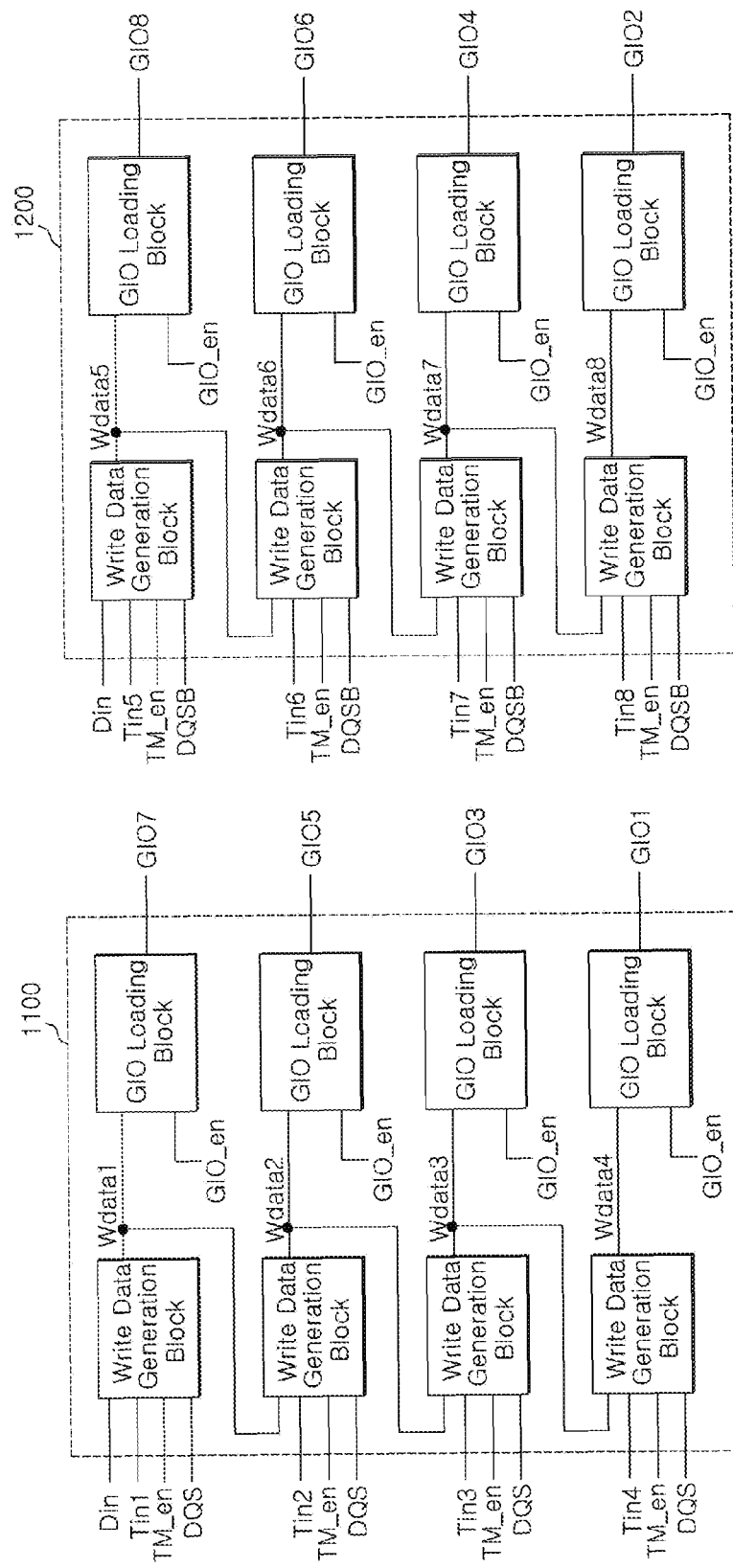
FIG. 10 is a schematic block diagram of a data transmission device according to another embodiment.

FIG. 10 is a schematic block diagram of a data transmission device according to another embodiment. The data transmission device is suitable for a semiconductor memory apparatus using both the 8-bit pre-fetch scheme and the DDR scheme. The data transmission device shown in FIG. 10 includes an odd sequence-data transmission block 1100 and an even sequence-data transmission block 1200. The odd sequence-data transmission block 1100 is configured to apply bits in odd sequences of sequentially inputted 8-bit input data Din to a first input/output line GIO1, a third input/output line GIO3, a fifth input/output line GIO5, and a seventh input/output line GIO7. The even sequence-data transmission block 1200 is configured to apply bits in even sequences of the input data Din to a second input/output line GIO2, a fourth input/output line GIO4, a sixth input/output line GIO6, and an eighth input/output line GIO8. Since the odd sequence-data transmission block 1100 is an example obtained by expanding the data transmission device shown in FIG. 4 and operates on the same principle as that of the data transmission device shown in FIG. 4, a detailed description thereof will be omitted. Unlike the odd sequence-data transmission block 1100 configured to generate first to fourth write data Wdata1 to Wdata4 based on the activation timing of the data strobe signal DQS, the even sequence-data transmission block 1200 is configured to generate fifth to eighth write data Wdata5 to Wdata8 based on the deactivation timing of the data strobe signal DQS, that is, the data strobe bar signal DQSB. The operation based on the deactivation timing of the data strobe signal DQS, that is, the data strobe bar signal DQSB is set in order to use the DDR scheme. The data transmission device shown in FIG. 10 requires four periods based on an external clock when applying the 8-bit input data Din to the first to eighth input/output lines in the normal mode. Furthermore, the data transmission device requires one period based on the external clock when applying first to eighth test data Tin1 to Tin8 to the first to eighth input/output lines in the test mode.

So far, the embodiment of the present invention has been described in detail. For reference, embodiments including additional component elements, which are not directly associated with the technical spirit of the present invention, may be exemplified in order to describe the present invention in further detail. Moreover, an active high configuration or an active low configuration for indicating the activated states of signals and circuits may vary depending upon an embodiment. Since these embodiment changes have a large number of cases and can be easily inferred by those skilled in the art, the enumeration thereof will be omitted herein.

While certain embodiments have been described above, it will be understood to those skilled in the art that the embodiments described are by way of example only. Accordingly, the data transmission device described herein should not be limited based on the described embodiments. Rather, the data transmission device described herein should only be limited in light of the claims that follow when taken in conjunction with the above description and accompanying drawings.

What is claimed is:

1. A data transmission device in a semiconductor memory apparatus comprising:
   a write data generation block configured to sequentially latch a plurality of input data which are inputted serially based on activation of a data strobe signal and output latched input data as write data in a normal mode, and receive a plurality of test data which are inputted simultaneously regardless of activation of the data strobe signal and output received test data as the write data in a test mode; and
   a loading block configured to apply the write data to data input/output line in response to an enable signal.

2. The data transmission device according to claim 1, wherein the enable signal is activated once every one period of a clock signal when a test enable signal is activated.

3. The data transmission device according to claim 1, wherein the write data generation block comprises:
   a normal data output unit configured to latch and output the input data as the write data based on activation timing of the data strobe signal in response to a test enable signal; and
   a test data output unit configured to receive and output the test data as the write data in response to the test enable signal.

4. The data transmission device according to claim 3, wherein the normal data output unit comprises:
   a data timing signal generation section configured to generate a data timing signal in response to the data strobe signal and the test enable signal; and
   a data transmission section configured to generate the write data in response to the data timing signal and the input data.

5. The data transmission device according to claim 1, wherein the test data is determined using a logical combination of test mode signals, or a combination of the test mode signals and at least a part of the input data.

6. The data transmission device according to claim 5, further comprising:
   a test data generation block configured to generate the test data using the logical combination of the test mode signals, or the combination of at least a part of the input data and the test mode signals.

7. A semiconductor memory apparatus comprising a data transmission device configured to sequentially latch a plurality of input data which are serially inputted every one period of a clock signal and apply latched input data to a plurality of input/output lines in response to an enable signal activated every predetermined period of the clock signal in a normal mode, and configured to apply a plurality of test data, which are inputted simultaneously, to the plurality of input/output lines in response to the enable signal activated every one period of the clock signal in a test mode.

8. The data transmission device according to claim 7, wherein the predetermined period is longer than one period.

9. The data transmission device according to claim 7, wherein the test data is determined using a logical combination of test mode signals, or a combination of the test mode signals and at least a part of the input data.

10. The data transmission device according to claim 9, further comprising:
a test data generation block configured to generate the test data using the logical combination of the test mode signals, or the combination of at least a part of the input data and the test mode signals.

11. A data transmission device comprising:
a first write data generation block configured to generate first write data from one of input data and first test data in response to a test enable signal and a data strobe signal;
a first loading block configured to apply the first write data to a first input/output line in response to an enable signal;
a second write data generation block configured to generate second write data from one of the first write data and second test data in response to the test enable signal and the data strobe signal; and
a second loading block configured to apply the second write data to a second input/output line in response to the enable signal.

12. The data transmission device according to claim 11, wherein the enable signal is activated once every one period of a clock signal when the test enable signal is activated.

13. The data transmission device according to claim 11, wherein the first write data generation block comprises:
a first normal data output unit configured to output the input data as the first write data based on activation timing of the data strobe signal in response to the test enable signal; and
a first test data output unit configured to generate the first write data from the first test data in response to the test enable signal, and
wherein the second write data generation block comprises:
a second normal data output unit configured to output the first write data as the second write data based on the activation timing of the data strobe signal in response to the test enable signal; and
a second test data output unit configured to generate the second write data from the second test data in response to the test enable signal.

14. The data transmission device according to claim 13, wherein, when the test enable signal is deactivated, the second normal data output unit outputs the first write data as the second write data based on the activation timing of the data strobe signal, and the first normal data output unit outputs the input data as the first write data based on the activation timing of the data strobe signal.

15. The data transmission device according to claim 14,
wherein the first normal data output unit and the second normal data output unit are configured to share a data timing signal generation section configured to generate a data timing signal in response to the data strobe signal and the test enable signal,
wherein the second normal data output unit includes a second data transmission section configured to generate the second write data in response to the data timing signal and the first write data, and
wherein the first normal data output unit includes a first data transmission section configured to generate the first write data in response to the data timing signal and the input data.

16. The data transmission device according to claim 11, wherein the first test data and the second test data are determined using a logical combination of a test mode signals, or a combination of the test mode signals and at least a part of the input data.

17. The data transmission device according to claim 16, further comprising:
a test data generation block configured to generate the first test data and the second test data using the logical combination of the test mode signals, or the combination of at least a part of the input data and the test mode signals.

* * * * *